(12) United States Patent
Cremer et al.

(10) Patent No.: US 11,347,470 B2
(45) Date of Patent: May 31, 2022

(54) DETECTION OF MEDIA PLAYBACK LOUDNESS LEVEL AND CORRESPONDING ADJUSTMENT TO AUDIO DURING MEDIA REPLACEMENT EVENT

(71) Applicant: Roku, Inc., San Jose, CA (US)

(72) Inventors: Markus K. Cremer, Orinda, CA (US); Shashank Merchant, Sunnyvale, CA (US); Aneesh Vartakavi, Emeryville, CA (US)

(73) Assignee: Roku, Inc., San Jose, CA (US)

( * ) Notice: Subject to any disclaimer, the term of this patent is extended or adjusted under 35 U.S.C. 154(b) by 0 days.

(21) Appl. No.: 16/673,859

(22) Filed: Nov. 4, 2019

(65) Prior Publication Data

US 2020/0159489 A1 May 21, 2020

Related U.S. Application Data

(60) Provisional application No. 62/909,676, filed on Oct. 2, 2019, provisional application No. 62/861,474, filed (Continued)

(51) Int. Cl.
*H04N 21/439* (2011.01)
*H04N 21/81* (2011.01)
(Continued)

(52) U.S. Cl.
CPC .............. *G06F 3/165* (2013.01); *G06N 3/08* (2013.01); *H03G 3/24* (2013.01); *H03G 3/3005* (2013.01);
(Continued)

(58) Field of Classification Search
CPC ......... H04N 21/44016; H04N 21/4396; H04N 21/4622; H04N 21/812; H04N 5/147;
(Continued)

(56) References Cited

U.S. PATENT DOCUMENTS 5,822,018 A 10/1998 Farmer
9,686,586 B2 * 6/2017 Kosslyn ................ G06F 16/683
(Continued)

FOREIGN PATENT DOCUMENTS

CN 103813184 5/2014
CN 104838333 A 8/2015
(Continued)

OTHER PUBLICATIONS

Office Action for U.S. Appl. No. 16/684,514 dated Oct. 28, 2020, 17 pages.
(Continued)

*Primary Examiner* — Nathan J Flynn
*Assistant Examiner* — Christine A Kurien
(74) *Attorney, Agent, or Firm* — McDonnell Boehnen Hulbert & Berghoff LLP

(57) ABSTRACT

In one aspect, an example method includes (i) presenting first media content from a first source; (ii) encountering a trigger to switch from presenting the first media content from the first source to presenting second media content from a second source; (iii) determining a first loudness level of the first media content; (iv) determining a second loudness level of the second media content; (v) based on a difference between the first loudness level and the second loudness level, adjusting a loudness level of the second media content so as to generate modified media content having a third loudness level that is different from the second loudness level; and (vi) responsive to encountering the trigger, presenting the modified media content having the third loudness level.

20 Claims, 5 Drawing Sheets

Related U.S. Application Data on Jun. 14, 2019, provisional application No. 62/768,596, filed on Nov. 16, 2018.

(51) Int. Cl.
*H03G 3/24* (2006.01)
*H04N 5/14* (2006.01)
*G06F 3/16* (2006.01)
*H03G 3/30* (2006.01)
*G06N 3/08* (2006.01)

(52) U.S. Cl.
CPC ........... *H03G 3/3089* (2013.01); *H04N 5/147* (2013.01); *H04N 21/439* (2013.01); *H04N 21/812* (2013.01)

(58) Field of Classification Search
CPC .............. H04N 21/439; H04N 21/458; H04N 21/4394; H04N 5/60; G06F 3/165; G06N 3/08; H03G 3/3089; H03G 3/24; H03G 3/3005
See application file for complete search history.

(56) References Cited

U.S. PATENT DOCUMENTS

| | | | |
|---|---|---|---|
| 11,042,353 | B2 | 6/2021 | Cremer et al. |
| 11,068,232 | B2 | 7/2021 | Cremer et al. |
| 2002/0068525 | A1 | 6/2002 | Brown et al. |
| 2004/0109094 | A1 | 6/2004 | Lindsay et al. |
| 2012/0250895 | A1 | 10/2012 | Katsianos |
| 2015/0012938 | A1* | 1/2015 | Kosslyn ............ G06F 16/683 725/32 |
| 2015/0319506 | A1 | 11/2015 | Kansara et al. |
| 2015/0350694 | A1* | 12/2015 | Meembat ........... H04N 21/4394 725/32 |
| 2016/0191007 | A1 | 6/2016 | Li et al. |
| 2016/0254795 | A1 | 9/2016 | Ballard |
| 2017/0094215 | A1 | 3/2017 | Western |
| 2017/0094351 | A1 | 3/2017 | Gorden |
| 2017/0311107 | A1 | 10/2017 | Ward et al. |
| 2018/0069517 | A1 | 3/2018 | Crockett et al. |
| 2018/0234728 | A1* | 8/2018 | Hwang .............. H04N 21/4316 |
| 2018/0270526 | A1 | 9/2018 | Nguyen et al. |
| 2018/0302672 | A1 | 10/2018 | Gordon |
| 2019/0131948 | A1 | 5/2019 | Cho et al. |
| 2019/0179506 | A1 | 6/2019 | Chen et al. |
| 2020/0162048 | A1 | 5/2020 | Cremer et al. |
| 2021/0271448 | A1 | 9/2021 | Cremer et al. |

FOREIGN PATENT DOCUMENTS

| | | | |
|---|---|---|---|
| CN | 102946520 B | 12/2016 | |
| CN | 107111646 A | 8/2017 | |
| CN | 107633850 A | 1/2018 | |
| JP | 2006166187 A | 6/2006 | |
| JP | 2017169159 A | 9/2017 | |
| KR | 10-2009-0057813 | 6/2009 | |
| KR | 10-2014-0033860 | * 3/2014 | ............... H03G 3/32 |
| KR | 10-2014-0033860 A | 3/2014 | |
| WO | 2014067206 A1 | 5/2014 | |

OTHER PUBLICATIONS

International Search Report received for PCT Patent Application No. PCT/US2019/061632, dated Mar. 5, 2020, 5 pages.
Written Opinion received for PCT Patent Application No. PCT/US2019/061632, dated Mar. 5, 2020, 7 pages.
The International Search Report and Written Opinion of the International Searching Authority dated Dec. 11, 2020 and issued in connection with International Application No. PCT/US2019/059882, filed Nov. 5, 2019, 10 pages.
Non-final Office Action dated Dec. 9, 2021 for U.S. Appl. No. 17/325,075, 13 pages.

* cited by examiner

DETECTION OF MEDIA PLAYBACK LOUDNESS LEVEL AND CORRESPONDING ADJUSTMENT TO AUDIO DURING MEDIA REPLACEMENT EVENT

CROSS-REFERENCE TO RELATED APPLICATIONS

This disclosure claims priority to U.S. Provisional Patent App. No. 62/768,596, filed on Nov. 16, 2018, U.S. Provisional Patent App. No. 62/861,474, filed on Jun. 14, 2019, and U.S. Provisional Patent App. No. 62/906,676, filed on Oct. 2, 2019, each of which is hereby incorporated by reference in its entirety.

USAGE AND TERMINOLOGY

In this disclosure, unless otherwise specified and/or unless the particular context clearly dictates otherwise, the terms "a" or "an" mean at least one, and the term "the" means the at least one.

In this disclosure, the term "connection mechanism" means a mechanism that facilitates communication between two or more components, devices, systems, or other entities. A connection mechanism can be a relatively simple mechanism, such as a cable or system bus, or a relatively complex mechanism, such as a packet-based communication network (e.g., the Internet). In some instances, a connection mechanism can include a non-tangible medium (e.g., in the case where the connection is wireless).

In this disclosure, the term "computing system" means a system that includes at least one computing device. In some instances, a computing system can include one or more other computing systems.

BACKGROUND

In coming years, the replacement of advertisements in media content with targeted advertisements is expected to become an increasingly important advertising method. By way of example, in a dynamic advertisement insertion (DAI) system, a content provider can insert generic advertisements into advertisement-breaks that interrupt sequences of media content, such as live or pre-recorded content. Each advertisement-break can include a set of advertisements arranged in a predetermined order. Further, a particular one of the advertisements can be designated or dynamically selected to be replaced with replacement media content, such as a targeted advertisement.

With this arrangement, prior to displaying the particular advertisement, the playback device can obtain the replacement media content, and then provide the replacement media content for display instead of the particular advertisement. For instance, responsive to determining that the playback device is playing or about to play content immediately preceding the particular advertisement to be replaced, the playback device can retrieve a targeted advertisement from a database, and then provide the targeted advertisement for display in place of the particular advertisement at the appropriate time.

SUMMARY

In one aspect, an example method is disclosed. The method includes (i) presenting, by a playback device, first media content from a first source; (ii) encountering, by the playback device, a trigger to switch from presenting the first media content from the first source to presenting second media content from a second source; (iii) determining, by the playback device, a first loudness level of the first media content; (iv) determining, by the playback device, a second loudness level of the second media content; (v) based on a difference between the first loudness level and the second loudness level, adjusting, by the playback device, a loudness level of the second media content so as to generate modified media content having a third loudness level that is different form the second loudness level; and (vi) responsive to encountering the trigger, presenting, by the playback device, the modified media content having the third loudness level.

In another aspect, an example non-transitory computer-readable medium is disclosed. The computer-readable medium has stored thereon program instructions that upon execution by a processor, cause performance of a set of acts including (i) presenting first media content from a first source; (ii) encountering a trigger to switch from presenting the first media content from the first source to presenting second media content from a second source; (iii) determining a first loudness level of the first media content; (iv) determining a second loudness level of the second media content; (v) based on a difference between the first loudness level and the second loudness level, adjusting a loudness level of the second media content so as to generate modified media content having a third loudness level that is different form the second loudness level; and (vi) responsive to encountering the trigger, presenting the modified media content having the third loudness level.

In another aspect, an example computing system is disclosed. The computing system is configured for performing a set of acts including (i) presenting first media content from a first source; (ii) encountering a trigger to switch from presenting the first media content from the first source to presenting second media content from a second source; (iii) determining a first loudness level of the first media content; (iv) determining a second loudness level of the second media content; (v) based on a difference between the first loudness level and the second loudness level, adjusting a loudness level of the second media content so as to generate modified media content having a third loudness level that is different form the second loudness level; and (vi) responsive to encountering the trigger, presenting the modified media content having the third loudness level.

DETAILED DESCRIPTION

I. Overview

Figure 1:
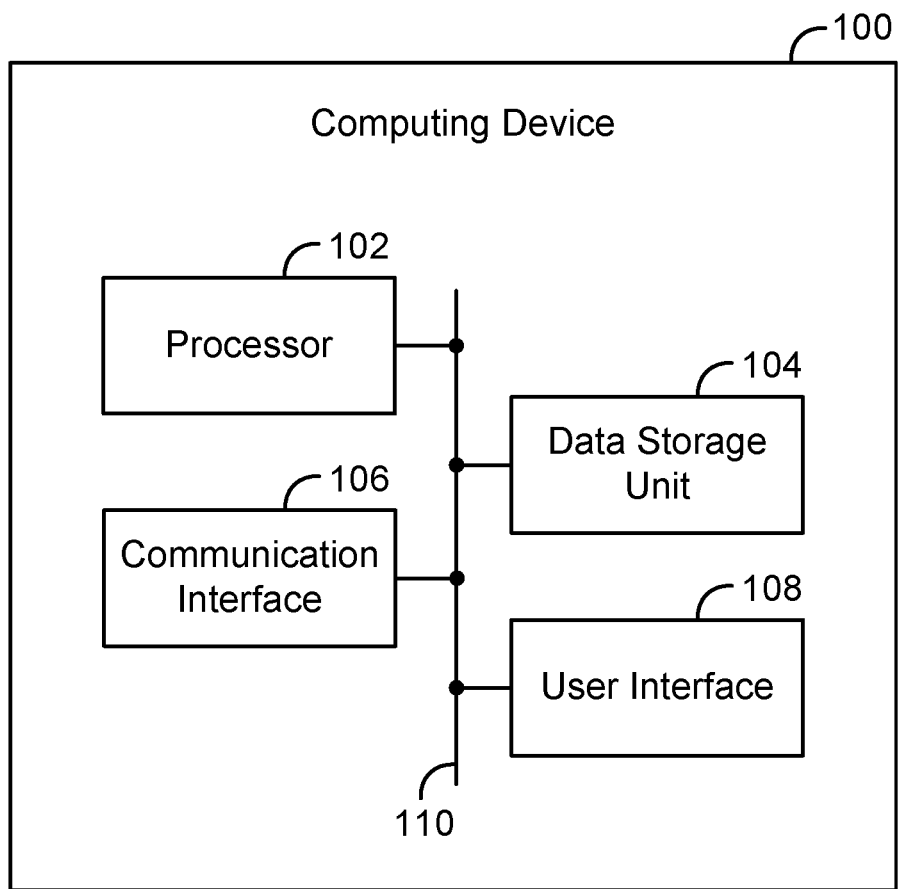
FIG. 1 is a simplified block diagram of an example computing device.

During a media content replacement event on a playback device, second media content (i.e. replacement media content) is presented in lieu of a portion of first media content.

For instance, during a media content replacement event, a segment of first media content received from a first source is replaced with second media content received from a second source. To effect the replacement, the playback device can switch from presenting first media content that is received from the first source to presenting second media content that is received from the second source.

In some cases, any volume playback information of the first source, which may be set by a device providing an audio signal to the playback device, might not be accessible to the playback device. As a consequence, upon switching to presenting media content from the second source, the playback device may present the replacement media content at a loudness level that does not correspond to the loudness level at which the content from the first source is being presented. For instance, the playback device may switch from presenting first media content having a first loudness level to presenting second media content having a second loudness level that is different from the first loudness level. This can lead to a poor or frustrating user-experience for the viewer. For example, an increase in loudness may irritate the viewer. Conversely, a decrease in loudness might make the replacement media content difficult to hear or even imperceptible for the viewer.

Disclosed herein are methods and systems to address this and potentially other issues. In an example method, a playback device can present first media content from a first source. The playback device can then encounter a trigger to switch from presenting the first media content from the first source to presenting second media content from a second source. Further, the playback device can determine a first loudness level of the first media content and a second loudness level of the second media content. Based on a difference between the first loudness level and the second loudness level, the playback device can then adjust a loudness of the second media content so as to generate modified media content having a third loudness level that is different from the second loudness level. And responsive to encountering the trigger, the playback device can present the modified media content having the third loudness level. Advantageously, a difference between the first loudness level and the third loudness level may be less than a difference between the first loudness level and the second loudness level, thereby improving the viewer experience.

While portions of this disclosure refer to a media content replacement event involving an advertisement, the examples are not meant to be limiting. The systems and methods disclosed herein are also applicable to replacing any content segment that is part of a content stream from one source with a content segment from another source. Other types of replaceable content can include weather segments, news segments, sports segments, radio advertisements, etc. The content stream that includes replaceable content can also be provided from a variety of sources, such as server or URL on the internet. Thus, the examples provided below are not meant to be limiting.

II. Example Architecture

A. Computing Device

FIG. 1 is a simplified block diagram of an example computing device 100. Computing device 100 can perform various acts and/or functions, such as those described in this disclosure. Computing device 100 can include various components, such as processor 102, data storage unit 104, communication interface 106, and/or user interface 108.

These components can be connected to each other (or to another device, system, or other entity) via connection mechanism 110.

Processor 102 can include a general-purpose processor (e.g., a microprocessor) and/or a special-purpose processor (e.g., a digital signal processor (DSP)).

Data storage unit 104 can include one or more volatile, non-volatile, removable, and/or non-removable storage components, such as magnetic, optical, or flash storage, and/or can be integrated in whole or in part with processor 102. Further, data storage unit 104 can take the form of a non-transitory computer-readable storage medium, having stored thereon program instructions (e.g., compiled or non-compiled program logic and/or machine code) that, when executed by processor 102, cause computing device 100 to perform one or more acts and/or functions, such as those described in this disclosure. As such, computing device 100 can be configured to perform one or more acts and/or functions, such as those described in this disclosure. Such program instructions can define and/or be part of a discrete software application. In some instances, computing device 100 can execute program instructions in response to receiving an input, such as from communication interface 106 and/or user interface 108. Data storage unit 104 can also store other types of data, such as those types described in this disclosure.

Communication interface 106 can allow computing device 100 to connect to and/or communicate with another entity according to one or more protocols. In one example, communication interface 106 can be a wired interface, such as an Ethernet interface or a high-definition serial-digital-interface (HD-SDI). In another example, communication interface 106 can be a wireless interface, such as a cellular or WI-FI interface. In this disclosure, a connection can be a direct connection or an indirect connection, the latter being a connection that passes through and/or traverses one or more entities, such as a router, switcher, or other network device. Likewise, in this disclosure, a transmission can be a direct transmission or an indirect transmission.

User interface 108 can facilitate interaction between computing device 100 and a user of computing device 100, if applicable. As such, user interface 108 can include input components such as a keyboard, a keypad, a mouse, a touch-sensitive panel, a microphone, and/or a camera, and/or output components such as a display device (which, for example, can be combined with a touch-sensitive panel), a sound speaker, and/or a haptic feedback system. More generally, user interface 108 can include hardware and/or software components that facilitate interaction between computing device 100 and the user of the computing device 100.

Computing device 100 can take various forms, such as a workstation terminal, a desktop computer, a laptop, a tablet, a mobile phone, or a television.

B. Dynamic Advertisement Insertion (DAI) System

Figure 2:
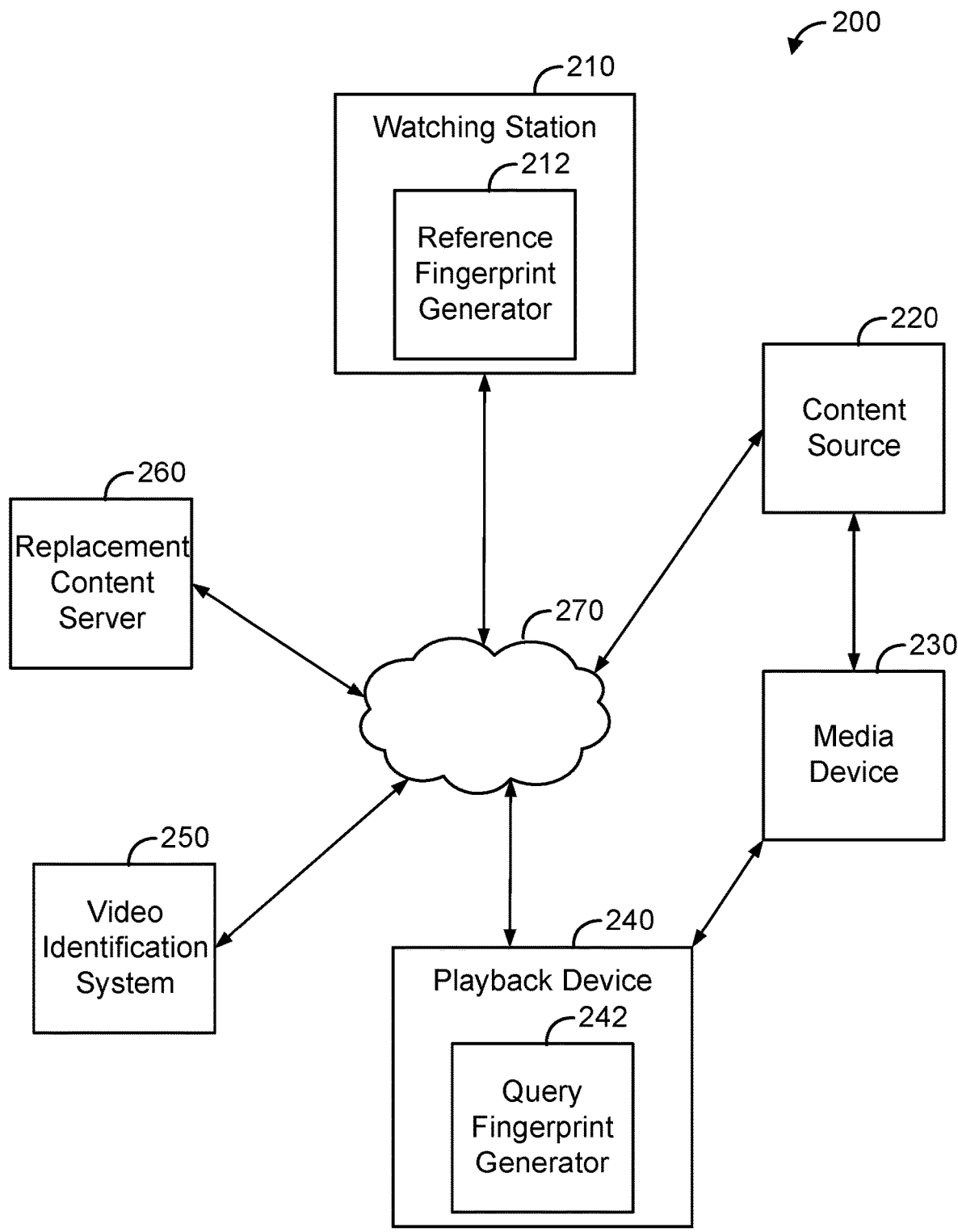
FIG. 2 is a simplified block diagram of an example dynamic advertisement insertion (DAI) system.

FIG. 2 is a simplified block diagram of an example DAI system 200. The DAI system 200 can perform various acts and/or functions related to the delivery and/or presentation of media content (e.g., audio content and/or video content), and can be implemented as a computing system.

DAI system 200 can include various components, such as a watching station 210, a content source 220, a media device 230, a playback device 240, a video identification system 250, and a replacement content server 260, each of which can be implemented as a computing system. Watching station 210 can receive video and other multimedia content from content source 220, such as a broadcaster, web server, or cable television (TV) station. For example, content source 220 may be a broadcaster, such as a TV station or TV network, which streams or transmits media over a TV channel to watching station 210, and/or a web service, such as a website, that streams or transmits media over a network 270 to watching station 210. Watching station 210 includes a reference fingerprint generator 212 that generates reference fingerprints of video content received from content source 220.

Media device 230 can receive the video and other multimedia content from content source 220, such as via a broadcast channel and/or over network 270. Media device 230 can modify the received content before sending content to playback device 240. Media device 230 can include a tuner configured to receive an input stream of video content and generate an output stream of video content by processing the input stream. Media device 230 can be a device equipped with tuners, decoders, and other hardware and/or software such that media device 230 can access video content through a video content distribution network, such as a terrestrial broadcast, cable, and/or satellite broadcast network employed by multichannel video programming distributors. Additionally or alternatively, media device 230 can be a device equipped with network adapters, decoders, and other hardware and/or software such that media device 230 can access video content through a wide area network (e.g., the internet) employed by devices for accessing internet video streaming services. Media device 230 can output signals (e.g., digital or analog signals) usable by a speaker and display of playback device 240 to present video content to a user.

Playback device 240 is any device capable of receiving and presenting a stream of video and/or other multimedia content (e.g., a TV, a laptop or other personal computer (PC), a tablet or other mobile device, or a gaming device). Playback device 240 includes a display or other user interface configured to display a processed stream of video content. The display may be a flat-panel screen, a plasma screen, a light emitting diode (LED) screen, a cathode ray tube (CRT), a liquid crystal display (LCD), or a projector. Playback devices can also include one or more speakers. In addition, playback device 240 can include an antenna configured to receive audio and video by way of an over-the-air broadcast channel.

Network 270 may be any network that enables communication between devices, such as a wired network and/or a wireless network (e.g., a mobile network). Network 270 can include one or more portions that constitute a private network (e.g., a cable TV network or a satellite TV network) or a public network (e.g., over-the-air broadcast channels or the internet).

Video identification system 250 can communicate with watching station 210 and playback device 240 over network 270. Video identification system 250 may receive a query fingerprint generated from video content by a query fingerprint generator 242 of playback device 240, and query an index of known fingerprints generated by a reference fingerprint generator 212 of watching station 210 in order to identify the video content. The query fingerprint may be a fingerprint of a frame or block of frames within the video content. Video identification system can identify the video content by matching the query fingerprint with one or more reference fingerprints. In some examples, video identification system 250 can be a component or module of playback device 240 or media device 230.

Upon identifying the video content, video identification system 250 can return to playback device 240 an identifier for replacement media content (e.g., alternative programming or alternative commercials) associated with the video content. The replacement media content can be stored in replacement content server 260. Using the identifier, playback device 240 can access the replacement media content from replacement content server 260 and then provide the replacement media content for display. Alternatively, replacement content server 260 or another computing system can send the replacement media content to playback device 240 or media device 230 in advance (e.g., a few seconds, minutes, or hours before media device 230 is scheduled to perform the replacement operation), for storage in a local cache of playback device 240 or media device 230. In this implementation, playback device 240 can access the replacement media content from the local cache, and then provide the replacement media content for display. Employing this local caching technique can help ensure that playback device 240 receives the replacement media content in time to carry out the replacement operation. This can be especially useful in situations where playback device 240 has an unreliable or unpredictable Internet connection, for instance.

Any of the modules, systems, and/or generators may be located at any of the devices shown in FIG. 2. For example, video identification system 250 can include query fingerprint generator 242. With this arrangement, video identification system can receive frames of video content from playback device 240 and generate the query fingerprints using the frames of video content. As another example, media device 230 and playback device 240 can be integrated together within a single device. Other variations are also possible.

Although the description of DAI system 200 and other portions of this disclosure refer to identifying video content using fingerprinting, the examples are not meant to be limiting. The systems and methods disclosed herein can also identify video content using watermarking. For instance, watching station 210 can embed a watermark within the video content (e.g., an audio watermark or a video watermark). With this approach, playback device 240 can detect the watermark within the video content, and send the watermark to video identification system 250. Or playback device 240 can send frames of video content to video identification system, and video identification system 250 can detect the watermark within the frames of video content. After obtaining the watermark, video identification system 250 can then identify the video content using the watermark, and return to playback device 240 an identifier for replacement media content associated with the video content.

Figure 3:
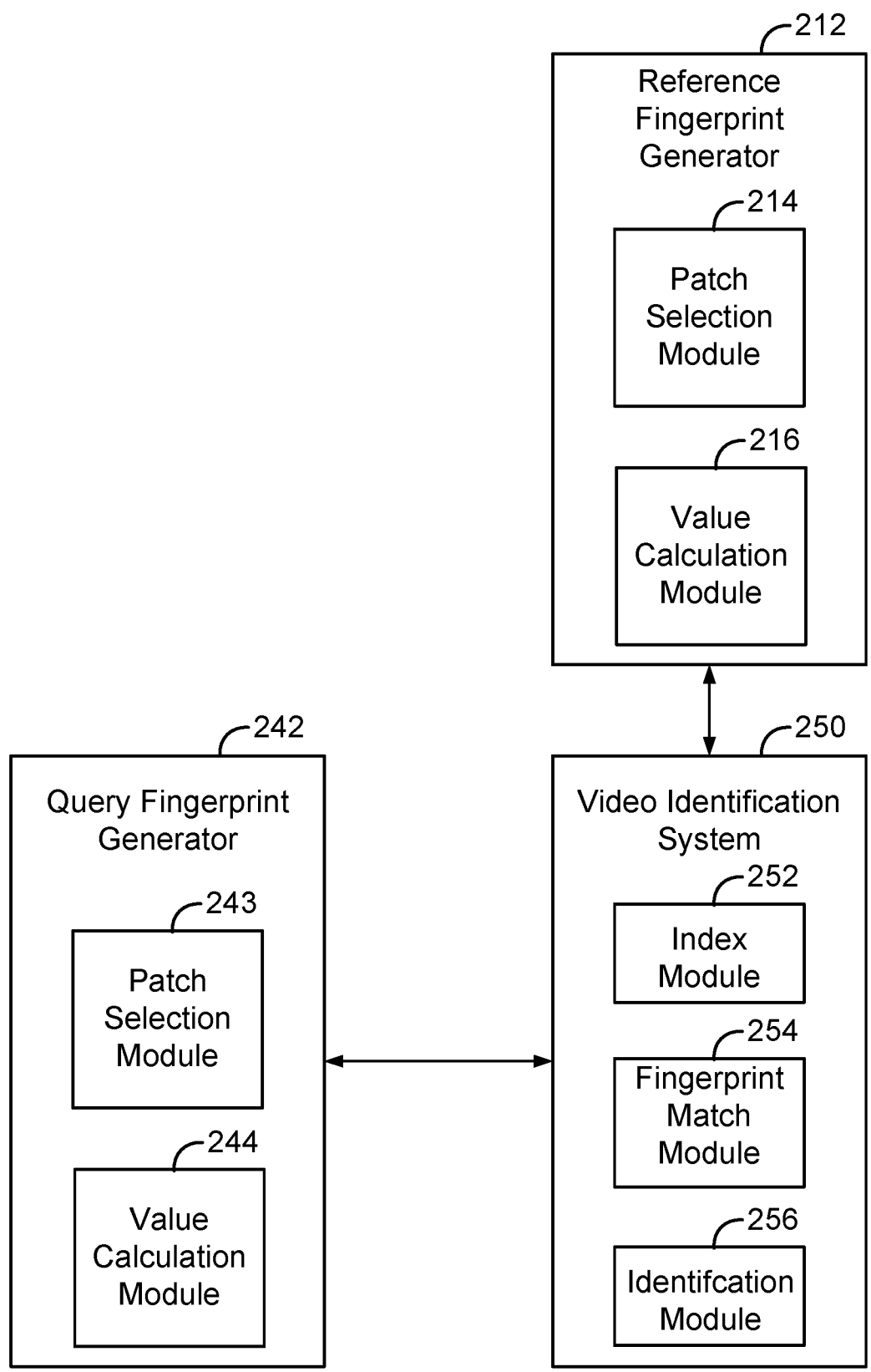
FIG. 3 is a simplified block diagram illustrating components of a reference fingerprint generator, a query fingerprint generator, and a video identification system, according to an example embodiment.

FIG. 3 is a simplified block diagram illustrating components of reference fingerprint generator 212, query fingerprint generator 242, and video identification system 250. As shown in FIG. 3, query fingerprint generator 242 includes a patch selection module 243 and a value calculation module 244, configured to communicate with each other (e.g., via a bus, shared memory, or a switch). Further, video identification system 250 includes an index module 252, a fingerprint match module 254, and an identification module 256, all configured to communicate with each other. Still further, reference fingerprint generator 212 includes a patch selection module 214 and a value calculation module 216, configured to communicate with each other.

One or more of the modules depicted in FIG. 3 can be implemented using hardware (e.g., a processor of a machine, a field-programmable gate array (FPGA), or an application-specific integrated circuit (ASIC), or a combination of hardware and software. Moreover, any two or more of the modules depicted in FIG. 3 can be combined into a single module, and the function described herein for a single module can be subdivided among multiple modules.

In line with the discussion above, query fingerprint generator 242 and reference fingerprint generator 212 can be configured to generate a query fingerprint of one or more frames of video content. For example, query fingerprint generator 242 and reference fingerprint generator 212 can calculate values of patches of one or more frames within the video content. Patches can be located at different locations within a frame. Query fingerprint generator 242 and reference fingerprint generator 212 can be configured to combine query fingerprints from multiple frames to generate a query fingerprint of a block of frames of the video content.

By way of example, patch selection module 243 of query fingerprint generator 242 can be configured to select multiple patches of video content, such as patches associated with one or more regions of a frame or frames within the video content. Similarly, patch selection module 214 of reference fingerprint generator 212 can be configured to select multiple patches of video content, such as patches associated with one or more regions of a frame of frames within the video content.

Patches can be defined by dividing a frame into a grid, such as a 2×2 grid, a 4×3 grid, or a 4×4 grid, and selecting patches based on the grid. For instance, twenty patches may be selected, with four large patches corresponding to quadrants of a frame, and four small patches corresponding to sub-quadrants of each quadrant (i.e. sixteen small patches in total). In some instances, patches may overlap. Further, patches can cumulatively span less than the entirety of a frame.

Value calculation module 244 of query fingerprint generator 242 can be configured to calculate a value for each of the selected multiple patches using, for example, an integral image technique. The integral image technique may calculate the values using a summed area table or other data structure that generates a sum of values of a group of pixels. Similarly, value calculation module 216 of reference fingerprint generator 212 can be configured to calculate a value for each of the selected multiple matches using, for example, an integral imaging technique.

In some examples, value calculation module 244 and value calculation module 216 can calculate a value for a patch by summing the values of a group of pixels with the patch, averaging the values of a group of pixels, or determining a media value of the group of pixels. Additionally or alternatively, value calculation module 244 and value calculation module 216 can calculate a value for a patch by computing differences between values of a group of pixels or computing a linear combination of values of a group of pixels.

Index module 252 of video identification system 250 can be configured to query a database of known reference fingerprints of video content, such as a database of known fingerprints stored within watching station 210 or video identification system 250, in order to identify reference fingerprints potentially matching a query fingerprint. Index module 252 can be configured to query an index of quantized patch values of the known reference fingerprints.

Fingerprint match module 254 of video identification system can be configured to compare a query fingerprint to one or more known reference fingerprints, and determine that the query fingerprint matches at least one known reference fingerprint. For example, fingerprint match module 254 can determine that query fingerprint matches at least one known reference fingerprint by determining that a similarity between the query fingerprint and at least one of the known reference fingerprints satisfies a predetermined threshold. The predetermined threshold can be associated with a Tanimoto distance measurement, a Manhattan distance measurement, or other distance measurements. Additionally or alternatively, fingerprint match module 254 can use other matching techniques, such as Euclidian, Cosine, KL-Divergence, and/or Itakura matching techniques.

Identification module 256, in turn, can be configured to identify video content based on a determination that a query fingerprint(s) matches at least one reference fingerprint(s). For example, identification module 256 can identify the name or title of video content, a location within the video content currently being presented by playback device 240, and/or a channel or broadcaster providing the video content.

Figure 4:
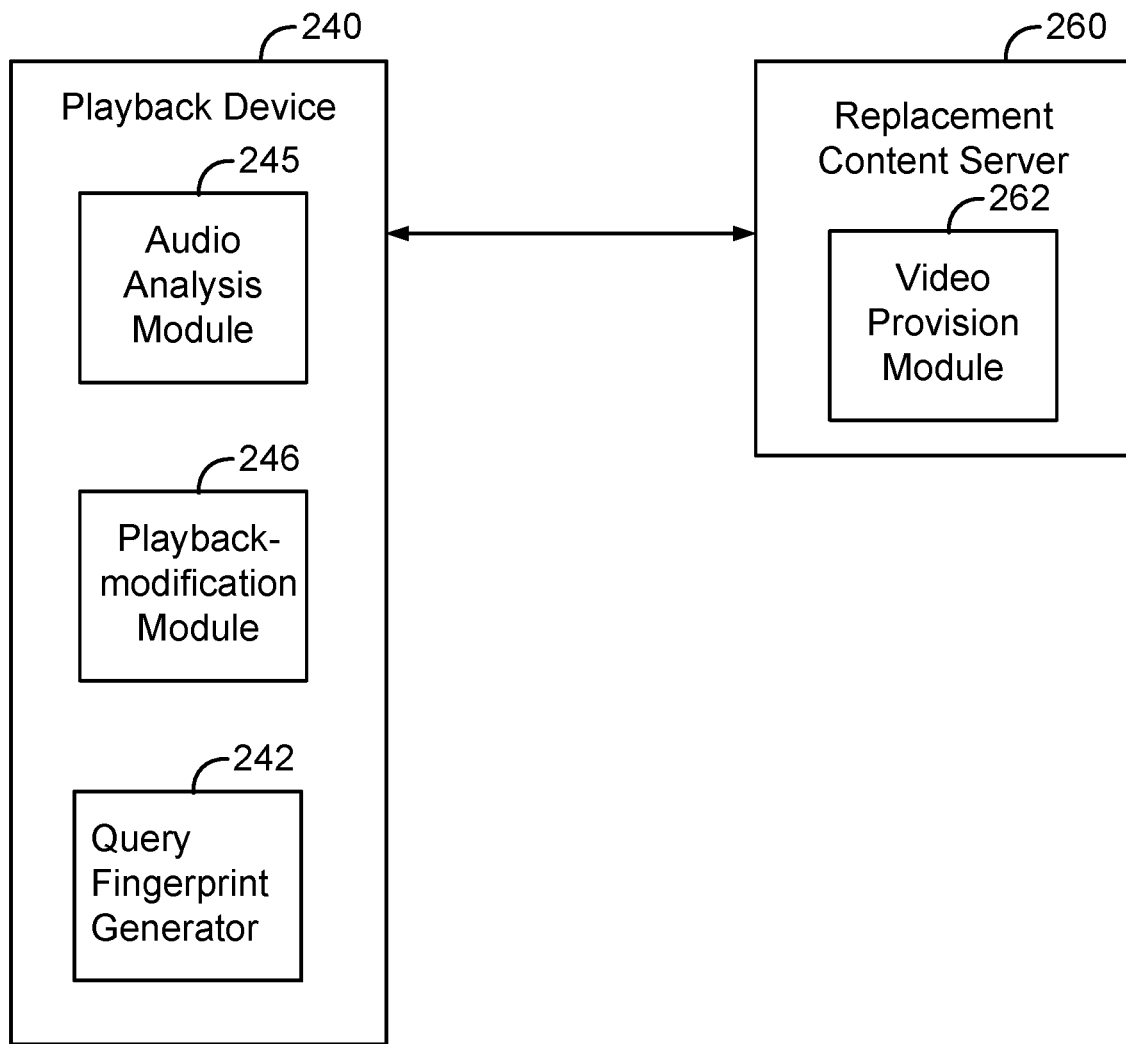
FIG. 4 is a simplified block diagram illustrating components of a playback device and a replacement content server, according to an example embodiment.

FIG. 4 is a simplified block diagram illustrating components of playback device 240 and replacement content server 260. As shown in FIG. 4, in addition to query fingerprint generator 242, playback device 240 includes an audio analysis module 245 and a playback-modification module 246, which can be configured to communicate with each other. Further, replacement content server 260 includes a video provision module 262.

In line with the discussion above, playback device 240 can encounter a trigger to carry out a media content replacement event. The media content replacement event can involve switching from presenting first media content from a first source to presenting second media content from a second source. The first source can be a first content pipe, and the second source can be a second content pipe that is different from the first content pipe. For instance, the first source can be either an over-the-air antenna or media device 230, and the second source can be either the Internet or a local cache of playback device 240. As a particular example, the first media content can be a first multimedia segment that is received by way of an over-the-air antenna or media device 230, and the second media content can be a second multimedia segment that is received from replacement content server 260 over network 270 and stored in a local cache of playback device 240. Alternatively, the first source can be an over-the-air antenna, and the second source can be media device 230. As another example, the first source can be network 270 (e.g., the first media content can be a multimedia stream), and the second source can be either a local cache of playback device 240 or media device 230.

Encountering the trigger can involve determining that playback device 240 is presenting a first segment that occurs immediately prior to a second segment that is to be replaced. Playback device 240 could determine that the first segment is being presented using any of the fingerprinting or watermarking techniques discussed above. Alternatively, encountering the trigger can involve playback device 240 receiving a replacement command from another device.

Playback device 240 can instruct audio analysis module 245 to determine a first loudness level of the first media content. Audio analysis module 245 can determine the first loudness level prior to encountering the trigger. The first loudness level can be a moving average that audio analysis module 245 continuously or intermittently determines as playback device 240 presents the first media content. In one example, on a fixed-interval basis, audio analysis module 245 can calculate a loudness level (e.g., root mean square (RMS)) for a recently presented portion of the first media content (e.g., the previous one minute, the previous thirty seconds, etc.). The first loudness level can be calculated using a loudness meter. As time goes on, audio analysis module 245 can average loudness levels of multiple portions of the first media content together (e.g., average of five, one-minute portions). The multiple portions of the first media content could be overlapping or separate from one another. Further, when a desired number of loudness levels are obtained, audio analysis module 245 can begin to replace the oldest (most-stale) loudness level with a new (most-recent) loudness level, so as to arrive at a moving average of the first loudness level. Other examples are also possible.

The loudness meter can include a software module configured to execute on playback device 240 and/or a server device with which playback device 240 is communicatively linked. The software module can execute various filtering algorithms, such as those recommended by the International Telecommunication Union, to determine the first loudness level. The software module can measure the individual loudness of multiple channels of an audio signal, and then average and sum the individual loudness measurements to determine the loudness level.

In some examples, a loudness level profile (i.e. loudness over time) for the first media content can be provided to playback device 240, either as a stream or in bulk, by a server. The loudness level profile can characterize how the loudness changes over time in the first media content. This could, e.g., on the server side, have been pre-computed and associated with a determined fixed volume value (e.g., average loudness, or some target volume measure). Audio analysis module 245, after aligning this loudness level profile with the loudness values measured from the first media content, can then determine, as the first loudness level, the difference in level from the reference (as analyzed remotely on the server) to the first media content as observed by the device. This difference can then be reliably used to modify the loudness level for the second media content.

In some examples, playback device 240 can detect a channel-change event. Upon detecting the channel-change event, playback device 240 can instruct audio analysis module 245 to reset the moving average of the first loudness level. As one example, playback device 240 could detect the channel-change event using audio and/or video fingerprinting of the first media content. As another example, playback device 240 could receive a signal (e.g., a High-Definition Multimedia Interface signal) from a device providing the first media content, with the signal indicating that a channel change has occurred. Playback device 240 could therefore determine, based on receipt of the signal, that a channel-change event occurred. As another example, playback device 240 could detect a channel-change event by using template matching to recognize the display of a channel bar that is presented by a device that provides the first media content (e.g., media device 230 of FIG. 2) in conjunction with channel changes.

When a channel-change event occurs shortly before a media content replacement event, such as within a threshold amount of time of a time at which the second media content is scheduled to be presented, audio analysis module 245 can determine the first loudness level in various other ways. For instance, audio analysis module 245 can use a loudness level measured from the previous channel as the first loudness level. As another example, audio analysis module 245 can use a previously determined loudness level for the new channel as the first loudness level. As still another example, audio analysis module 245 can use a default loudness level as the first loudness level.

Alternatively, if a channel-change event occurs within a threshold amount of time of a time at which the second media content is scheduled to be presented, playback device 240 may opt to abort the media content replacement event. Similarly, if the first loudness level is detected as being very low (e.g., lower than −60 dBFS) or an audio signal is completely missing/silent, playback device 240 may determine not to carry out the media content replacement event. Likewise, if a volume setting on playback device 240 is low or muted, playback device 240 can forgo carrying out the media content replacement event.

Video provision module 262 of replacement content server 260 can provide the second media content to playback device 240. For instance, video identification system 250 can identify video content that playback device 240 is providing for display and, based on the identified video content, video provision module 262 can provide replacement media content corresponding to the video content to playback device 240.

In line with the discussion above, playback device 240 can receive the second media content by way of a network communication interface. For instance, the second media content can be replacement media content that is streamed to playback device 240 over the Internet and then stored in a local cache of playback device 240. When playback device 240 encounters a trigger to insert the second media content into a sequence of media content, playback device 240 can retrieve the replacement media content from the local cache, and provide the replacement media content for display using a media player that is configured to display media files. When playback device 240 provides the replacement media content for display using a media player, the media player can present the replacement media content in a media-player layer that is on top of another layer in which other media content is provided for display, such as media content received from a media device or an antenna.

In some instances, providing the second media content for display can involve switching from providing media content that is received from media device 230 or an antenna to providing replacement media content that is stored in a database of playback device 240. Playback device 240 can include a system on a chip that includes a frame buffer. In order to provide the replacement media content for display, the media player of playback device 240 can insert the replacement media content into the frame buffer. Prior to inserting the replacement media content into the frame buffer, the system on a chip may have inserted media content that is received from media device 230 into the frame buffer.

The second media content can include a replacement advertisement. For instance, the second media content can include targeted advertisement that is to be substituted for a generic advertisement. As one example, the targeted advertisement can be a local advertisement, and the generic advertisement can be a national advertisement. As another example, the targeted advertisement can be an advertisement that is selected based on a demographic of a user of playback device 240.

Audio analysis module 245 of playback device 240 can determine a second loudness level of the second media content in various ways. As one example, audio analysis module 245 can determine the second loudness level based on auxiliary information that is received with the second media content from replacement content server 260. For instance, the second loudness level could be specified within header information of the second media content. As another example, audio analysis module 245 can determine the second loudness level by processing an audio signal associated with the second media content. As still another example, audio analysis module 245 can use a default loudness level to which advertisements are intended to conform as the second loudness level.

In some instances, the first loudness level and the second loudness level can be specified on an absolute scale. In other instances, the first loudness level and the second loudness level can be specified in decibels. The first loudness level and the second loudness level can include perceptual volume weighting such as K-weighting relative to full scale (LKFS).

Playback-modification module 246 can adjust the loudness of the second media content based on a difference between the first loudness level and the second loudness level so as to generate modified media content having a third loudness level. For instance, upon determining that the first loudness level is less than the second loudness level, playback-modification module 246 can decrease the loudness of the second media content. Decreasing the loudness level can involve decreasing the loudness of the second media content from the second loudness level to the third loudness level. The third loudness level could be approximately equal to the first loudness level. Or the third loudness level could be a level between the second loudness level and the first loudness level.

Whereas, upon determining that the first loudness level is greater than the second loudness level, playback-modification module 246 can increase the loudness of the second media content. For instance, playback-modification module 246 can increase the loudness of the second media content from the second loudness level to the third loudness level. The third loudness level could be approximately equal to the first loudness level. Or the third loudness level could be a level between the second loudness level and the first loudness level.

Adjusting the loudness level of the second media content can involve adjusting an audio signal of the second media content after decoding the audio signal. For instance, playback-modification module 246 can attenuate the audio signal to reduce the loudness or, conversely, playback-modification module 246 can amplify the audio signal to increase the loudness. When amplifying the loudness of the audio signal, playback-modification module 246 can use a compressor to reduce a difference between the lowest and highest points in the audio signal and/or use a limiter to prevent any peaks from exceeding a threshold.

In some examples, playback-modification module 246 can determine that a difference between the first loudness level and the second loudness level satisfies a threshold condition and, based on the difference satisfying the threshold condition, playback-modification module 246 can adjust the loudness of the second media content. Conversely, if the difference does not satisfy the threshold condition, playback-modification module 246 may refrain from adjusting the loudness of the second media content and present the second media content as is during the media content replacement event. The threshold condition may be the difference being greater than a threshold amount, for instance.

In an example use case, prior to carrying out the media content replacement event, playback device 240 may present a movie. The media content replacement event can be carried out during an advertisement break within the movie and can involve replacing a replaceable advertisement with second media content in the form of a replacement advertisement. Further, the replaceable advertisement can have a loudness level that is higher than a portion of the movie preceding the replaceable advertisement. By decreasing the loudness level of the replacement advertisement in accordance with the loudness level of the portion of the movie presented prior to the replacement advertisement, playback device 240 can provide a more pleasant (e.g., less irritating or jarring) user experience.

III. Example Operations

Figure 5:
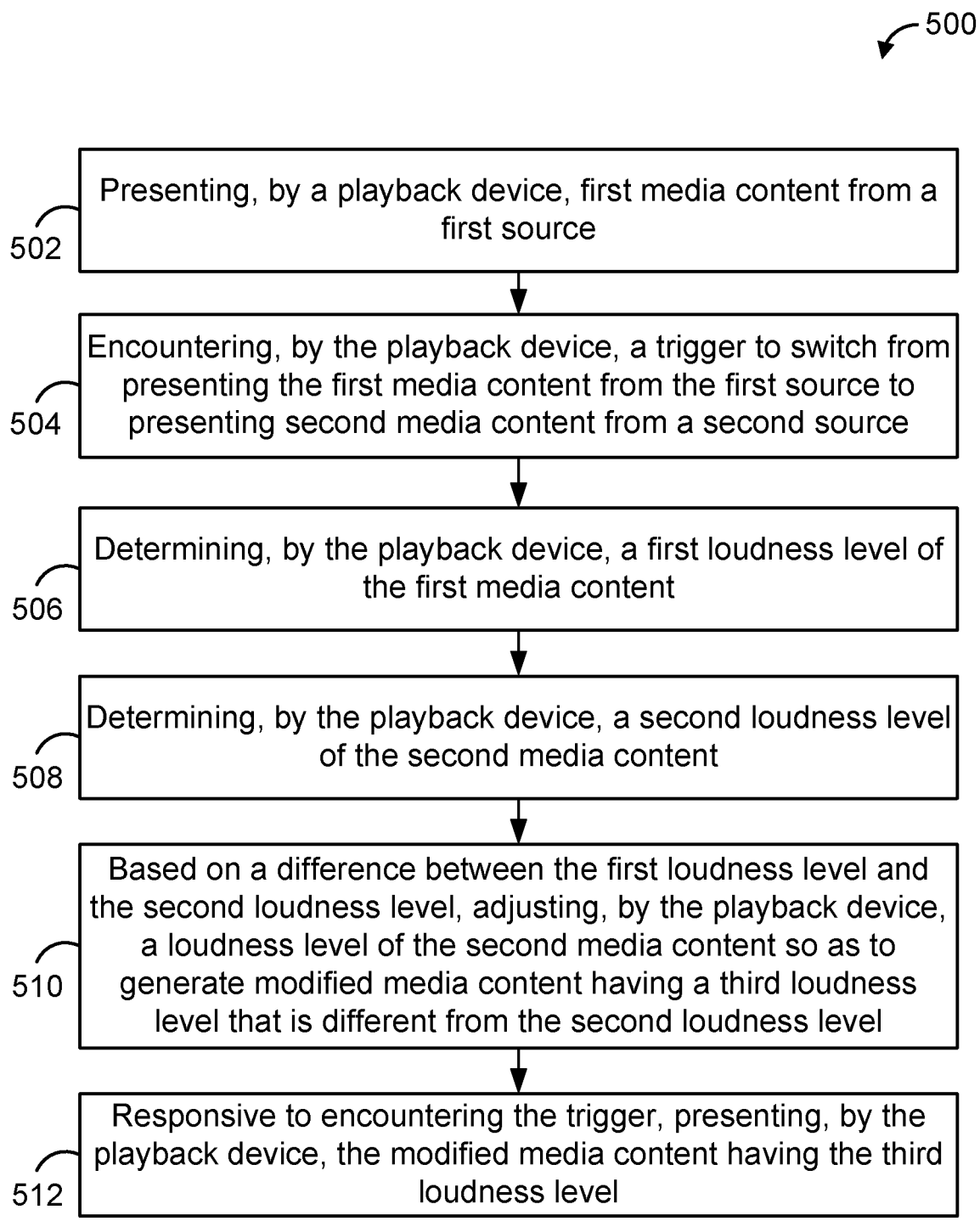
FIG. 5 is a flow chart of an example method.

FIG. 5 is a flow chart of an example method 500. Method 500 can be carried out by a playback device, such as playback device 240 or more generally, by a computing system. At block 502, method 500 includes presenting, by a playback device, first media content from a first source. At block 504, method 500 includes encountering, by the playback device, a trigger to switch from presenting the first media content from the first source to presenting second media content from a second source. At block 506, method 500 includes determining, by the playback device, a first loudness level of the first media content. At block 508, method 500 includes determining, by the playback device, a second loudness level of the second media content. At block 510, method 500 includes, based on a difference between the first loudness level and the second loudness level, adjusting, by the playback device, a loudness level of the second media content so as to generate modified media content having a third loudness level that is different from the second loudness level. And at block 512, method 500 includes, responsive to encountering the trigger, presenting, by the playback device, the modified media content having the third loudness level.

IV. Example Variations

Although some of the acts and/or functions described in this disclosure have been described as being performed by a particular entity, the acts and/or functions can be performed by any entity, such as those entities described in this disclosure. Further, although the acts and/or functions have been recited in a particular order, the acts and/or functions need not be performed in the order recited. However, in some instances, it can be desired to perform the acts and/or functions in the order recited. Further, each of the acts and/or functions can be performed responsive to one or more of the other acts and/or functions. Also, not all of the acts and/or functions need to be performed to achieve one or more of the benefits provided by this disclosure, and therefore not all of the acts and/or functions are required.

Although certain variations have been discussed in connection with one or more examples of this disclosure, these variations can also be applied to all of the other examples of this disclosure as well.

Although select examples of this disclosure have been described, alterations and permutations of these examples will be apparent to those of ordinary skill in the art. Other changes, substitutions, and/or alterations are also possible without departing from the invention in its broader aspects as set forth in the following claims.

The invention claimed is:

1. A method comprising:
   presenting, by a playback device, first media content from a first source;
   encountering, by the playback device, a trigger replace a replaceable content segment of the first media content with a replacement content segment, wherein the replacement content segment is stored in a local cache of the playback device;
   obtaining, by the playback device, a loudness level profile for the first media content, wherein the loudness level profile characterizes changes in loudness within the first media content over time;
   determining, by the playback device, a first loudness level of the first media content, wherein determining the first loudness level comprises comparing a loudness level observed by the playback device with a loudness level indicated by the loudness level profile;

determining, by the playback device, a second loudness level of the replacement content segment;

based on a difference between the first loudness level and the second loudness level, adjusting, by the playback device, a loudness level of the replacement content segment so as to generate a replacement content segment having a third loudness level that is different from the second loudness level; and responsive to encountering the trigger, presenting, by the playback device, the replacement content segment having the third loudness level in place of the replaceable content segment.

2. The method of claim 1, wherein determining the first loudness level comprises determining a moving average of the first loudness level as the playback device presents the first media content.

3. The method of claim 2, further comprising:
detecting a channel-change event; and
upon detecting the channel-change event, resetting the moving average of the first loudness level.

4. The method of claim 1, wherein determining the second loudness level comprises determining the second loudness level based on auxiliary information that is received with the replacement content segment.

5. The method of claim 1, wherein adjusting the loudness level of the replacement content segment based on the difference between the first loudness level and the second loudness level comprises increasing the loudness level of the replacement content segment from the second loudness level to the third loudness level based on the first loudness level being greater than the second loudness level.

6. The method of claim 1, wherein adjusting the loudness level of the replacement content segment based on the difference between the first loudness level and the second loudness level comprises decreasing the loudness level of the replacement content segment from the second loudness level to the third loudness level based on the first loudness level being less than the second loudness level.

7. The method of claim 1, further comprising retrieving the replacement content segment from the local cache.

8. The method of claim 1, wherein the playback device comprises a television, and wherein presenting the replacement content segment having the third loudness level comprises presenting the replacement content segment having the third loudness level using a media player.

9. The method of claim 1, wherein encountering the trigger comprises determining that the playback device is presenting a segment occurring immediately prior to the replaceable content segment, wherein the replaceable content segment is designated to be replaced with the replacement content segment.

10. The method of claim 9, wherein the segment occurring immediately prior to the replaceable content segment is a first advertisement, and wherein the replaceable content segment is a second advertisement.

11. A non-transitory computer-readable medium having stored thereon program instructions that upon execution by a processor, cause performance of a set of acts comprising:
presenting first media content from a first source,
encountering a trigger to replace a replaceable content segment of the first media content with a replacement content segment, wherein the replacement content segment is stored in a local cache of a playback device,
obtaining a loudness level profile for the first media content, wherein the loudness level profile characterizes changes in loudness within the first media content over time,
determining a first loudness level of the first media content, wherein determining the first loudness level comprises comparing a loudness level observed by the playback device with a loudness level indicated by the loudness level profile,
determining a second loudness level of the replacement content segment,
based on a difference between the first loudness level and the second loudness level, adjusting a loudness level of the replacement content segment so as to generate a replacement content segment having a third loudness level that is different from the second loudness level, and
responsive to encountering the trigger, presenting the replacement content segment having the third loudness level in place of the replaceable content segment.

12. The non-transitory computer-readable medium of claim 11, wherein determining the first loudness level comprises determining a moving average of the first loudness level as a playback device presents the first media content.

13. The non-transitory computer-readable medium of claim 11, wherein determining the second loudness level comprises determining the second loudness level based on auxiliary information that is received with the replacement content segment.

14. The non-transitory computer-readable medium of claim 11, wherein the set of acts further comprises retrieving the replacement content segment from the local cache.

15. The non-transitory computer-readable medium of claim 11, wherein encountering the trigger comprises determining that a playback device is presenting a segment occurring immediately prior to the replaceable content segment, wherein the replaceable content segment is designated to be replaced with the replacement content segment.

16. A computing system comprising:
one or more processors; and
a non-transitory computer-readable medium having stored therein instructions that are executable to cause the computing system to perform a set of acts comprising:
presenting first media content from a first source,
encountering a trigger to replace a replaceable content segment of the first media content with a replacement content segment, wherein the replacement content segment is stored in a local cache of a playback device,
obtaining a loudness level profile for the first media content, wherein the loudness level profile characterizes changes in loudness within the first media content over time,
determining a first loudness level of the first media content, wherein determining the first loudness level comprises comparing a loudness level observed by the playback device with a loudness level indicated by the loudness level profile,
determining a second loudness level of the replacement content segment,
based on a difference between the first loudness level and the second loudness level, adjusting a loudness level of the replacement content segment so as to generate a replacement content segment having a third loudness level that is different from the second loudness level, and responsive to encountering the trigger, presenting the replacement content segment having the third loudness level in place of the replaceable content segment.

17. The computing system of claim 16, wherein determining the first loudness level comprises determining a moving average of the first loudness level as a playback device presents the first media content.

18. The computing system of claim 16, wherein determining the second loudness level comprises determining the second loudness level based on auxiliary information that is received with the replacement content segment.

19. The computing system of claim 16, wherein the set of acts further comprises retrieving the replacement content segment from the local cache.

20. The computing system of claim 16, wherein encountering the trigger comprises determining that a playback device is presenting a segment occurring immediately prior to the replaceable content segment, wherein the replaceable content segment is designated to be replaced with the replacement content segment.

\* \* \* \* \*